(12) United States Patent
Yen et al.

(10) Patent No.: US 8,610,247 B2
(45) Date of Patent: Dec. 17, 2013

(54) STRUCTURE AND METHOD FOR A TRANSFORMER WITH MAGNETIC FEATURES

(75) Inventors: Hsiao-Tsung Yen, Tainan (TW); Yu-Ling Lin, Taipei (TW); Ying-Ta Lu, Fanlu Township, Chiayi County (TW); Huan-Neng Chen, Taichung (TW); Ho-Hsiang Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/340,856

(22) Filed: Dec. 30, 2011

(65) Prior Publication Data

US 2013/0168809 A1 Jul. 4, 2013

(51) Int. Cl.
*H01L 27/08* (2006.01)
(52) U.S. Cl.
USPC .................................. 257/531; 257/E23.021
(58) Field of Classification Search
CPC ...... H01L 23/5227; H01L 28/10; H01L 27/08
USPC ........................ 257/531, 723, 778, E23.021
See application file for complete search history.

(56) References Cited

U.S. PATENT DOCUMENTS

| | | | |
|---|---|---|---|
| 5,391,917 A | 2/1995 | Gilmour et al. | |
| 5,446,311 A | 8/1995 | Ewen et al. | |
| 5,510,298 A | 4/1996 | Redwine | |
| 5,767,001 A | 6/1998 | Bertagnolli et al. | |
| 5,831,331 A | 11/1998 | Lee | |
| 5,998,292 A | 12/1999 | Black et al. | |
| 6,091,318 A | 7/2000 | Lee et al. | |
| 6,184,060 B1 | 2/2001 | Siniaguine | |
| 6,322,903 B1 | 11/2001 | Siniaguine et al. | |
| 6,383,858 B1 | 5/2002 | Gupta et al. | |
| 6,407,647 B1 | 6/2002 | Apel et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,743,671 B2 | 6/2004 | Hu et al. | |
| 6,777,774 B2 | 8/2004 | Beng et al. | |
| 6,800,930 B2 | 10/2004 | Jackson et al. | |
| 6,815,739 B2 | 11/2004 | Huff et al. | |

(Continued)

OTHER PUBLICATIONS

Unpublished U.S. Appl. No. 12/791,705, filed Jun. 1, 2010, entitled "3D Inductor and Transformer", 54 pages.

(Continued)

*Primary Examiner* — Nikolay Yushin
(74) *Attorney, Agent, or Firm* — Haynes and Boone, LLP

(57) ABSTRACT

The present disclosure provides a semiconductor device. The semiconductor device includes a first inductor formed on a first substrate; a second inductor formed on a second substrate and conductively coupled with the first inductor as a transformer; and a plurality of micro-bump features configured between the first and second substrates. The plurality of micro-bump features include a magnetic material having a relative permeability substantially greater than one and are configured to enhance coupling between the first and second inductors.

20 Claims, 12 Drawing Sheets

(56) References Cited

U.S. PATENT DOCUMENTS

| | | |
|---|---|---|
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,154,161 B1 | 12/2006 | Blaschke et al. |
| 7,157,787 B2 | 1/2007 | Kim et al. |
| 7,193,308 B2 | 3/2007 | Matsui |
| 7,262,495 B2 | 8/2007 | Chen et al. |
| 7,265,433 B2 | 9/2007 | Pillai et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,485,912 B2 | 2/2009 | Wang |
| 7,764,512 B2 | 7/2010 | Jow et al. |
| 8,159,013 B2 | 4/2012 | Nishimura et al. |
| 8,227,892 B2 | 7/2012 | Chang |
| 2003/0020173 A1 | 1/2003 | Huff et al. |
| 2003/0060035 A1 | 3/2003 | Kimura et al. |
| 2003/0096435 A1 | 5/2003 | Acosta et al. |
| 2006/0001821 A1 | 1/2006 | Dewa et al. |
| 2006/0049481 A1 | 3/2006 | Tiemeijer et al. |
| 2006/0056219 A1 | 3/2006 | Araki et al. |
| 2006/0095639 A1* | 5/2006 | Guenin et al. ............ 710/310 |
| 2006/0157798 A1 | 7/2006 | Hayashi et al. |
| 2006/0202776 A1 | 9/2006 | Lee et al. |
| 2006/0232342 A1 | 10/2006 | Floyd et al. |
| 2007/0045812 A1 | 3/2007 | Heng |
| 2007/0194427 A1 | 8/2007 | Choi et al. |
| 2008/0020488 A1 | 1/2008 | Clevenger et al. |
| 2008/0290454 A1 | 11/2008 | Fujii |
| 2009/0085133 A1 | 4/2009 | Doan |
| 2009/0090995 A1 | 4/2009 | Yang |
| 2009/0183358 A1 | 7/2009 | Jow |
| 2009/0309234 A1 | 12/2009 | Knickerbocker et al. |
| 2010/0026368 A1* | 2/2010 | Tang et al. ............ 327/361 |
| 2010/0141354 A1 | 6/2010 | Cho |
| 2010/0193904 A1 | 8/2010 | Watt et al. |
| 2010/0199236 A1* | 8/2010 | Chen et al. ............ 716/3 |
| 2010/0214041 A1 | 8/2010 | Cho |
| 2010/0226112 A1 | 9/2010 | Jow et al. |
| 2010/0320611 A1 | 12/2010 | Uchida et al. |
| 2011/0036912 A1 | 2/2011 | Guo et al. |
| 2011/0050357 A1* | 3/2011 | Kim et al. ............ 333/32 |
| 2011/0068433 A1 | 3/2011 | Kim et al. |
| 2011/0133308 A1 | 6/2011 | Chan et al. |
| 2011/0170231 A1* | 7/2011 | Chandrasekaran et al. ............ 361/306.1 |
| 2011/0254132 A1 | 10/2011 | Cho et al. |
| 2011/0304013 A1 | 12/2011 | Chen et al. |
| 2011/0316147 A1 | 12/2011 | Shih et al. |
| 2012/0280366 A1 | 11/2012 | Kamgaing et al. |
| 2013/0043557 A1 | 2/2013 | Cho et al. |
| 2013/0043968 A1 | 2/2013 | Cho et al. |
| 2013/0044455 A1 | 2/2013 | Cho et al. |
| 2013/0056853 A1 | 3/2013 | Cho et al. |
| 2013/0093045 A1 | 4/2013 | Cho et al. |

OTHER PUBLICATIONS

Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Choi et al, "A High-Performance Mems Transformer for Silicon RF ICs," 2002, pp. 653-656, Department of Electrical Engineering and Computer Science (Division of Electrical Engineering), Korea Advanced Institute of Science and Technology (KAIST).

Lim et al. "Fully Symmetrical Monolithic Transformer (True 1: 1) for Silicon RFIC," Sep. 23, 2008, pp. 2301-2311, IEEE Transactions on Microwave Theory and Techniques, vol. 56, No. 10.

Choi et al, "A High-Performance Mems Transformer for Silicon RF ICs," 2002, pp. 653-656, Dept. of Electrical Engineering and Computer Science (Division of Electrical Engineering), Korea Advanced Institute of Science and Technology (KAIST).

Lim et al., "Fully Symmetrical Monolithic Transformer (True 1: 1) for Silicon RFIC," Sep. 23, 2008, pp. 2301-2311, IEEE Transactions on Microwave Theory and Techniques, vol. 56, No. 10.

* cited by examiner

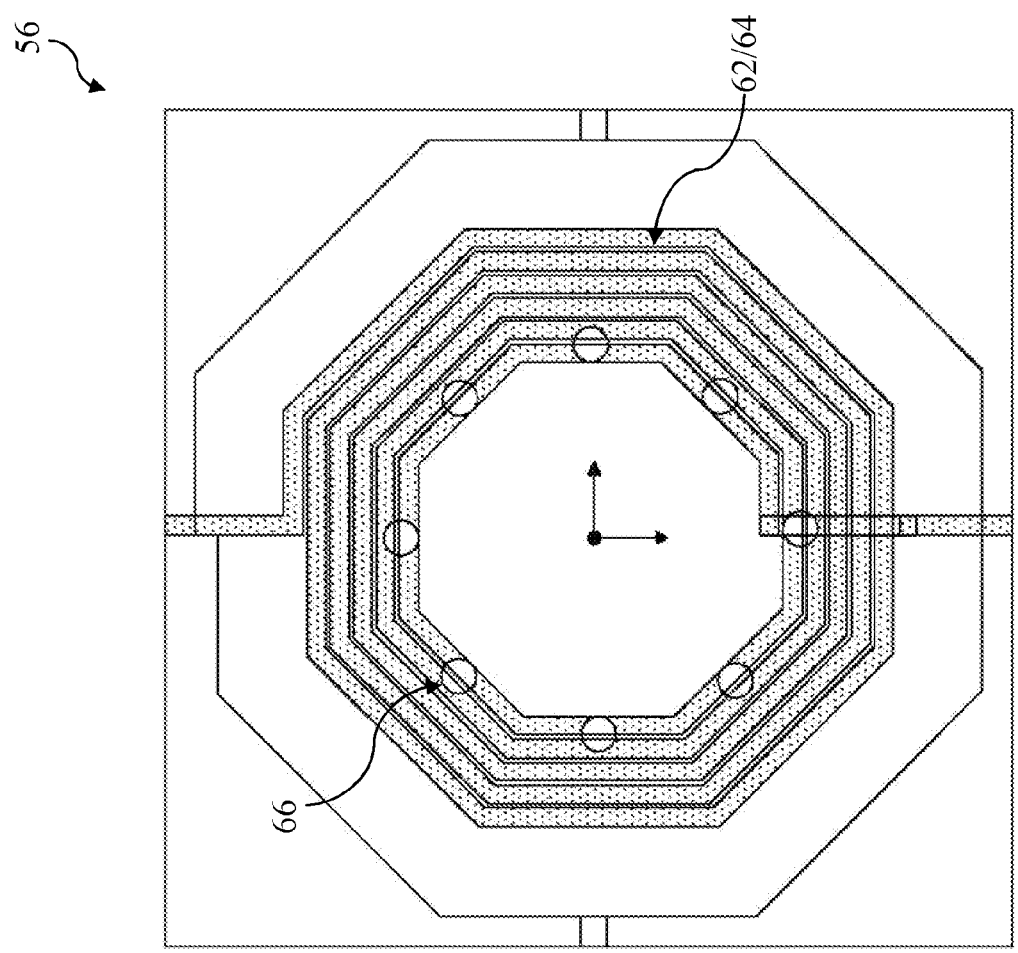

STRUCTURE AND METHOD FOR A TRANSFORMER WITH MAGNETIC FEATURES

CROSS REFERENCE

The following commonly-assigned U.S. patent applications, are incorporated herein by reference: U.S. Ser. No. 13/313,240 filed Dec. 7, 2011, by inventors Yu-Ling Lin, Hsiao-Tsung Yen, Ho-Hsiang Chen, and Chewn-Pu Jou for "IMPROVED INTEGRATED CIRCUIT GROUND SHIELDING STRUCTURE"; and U.S. Ser. No. 13/280,786 filed Oct. 25, 2011 by inventors Hsiao-Tsung Yen, Yu-Ling Lin, Chin-Wei Kuo, Ho-Hsiang Chen, and Min-Chie Jeng for "STRUCTURE AND METHOD FOR HIGH-K TRANSFORMER WITH CAPACITIVE COUPLING".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various active or passive electronic components can be formed on a semiconductor IC. For example, a transformer may be formed as a passive electronic component. As device sizes continue to decrease for even higher frequency applications, traditional transformer structures may encounter problems, such as reduced mutual inductive coefficient K and reduced self-resonant frequency. Particularly, the coupling efficiency drops down with decreased device size by advancing technology nodes.

Therefore, a structure of a transformer and a method making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a top view of a transformer integrated with a plurality of magnetic features constructed according to various aspects of the present disclosure in one embodiment.

DETAILED DESCRIPTION

Figure 1:
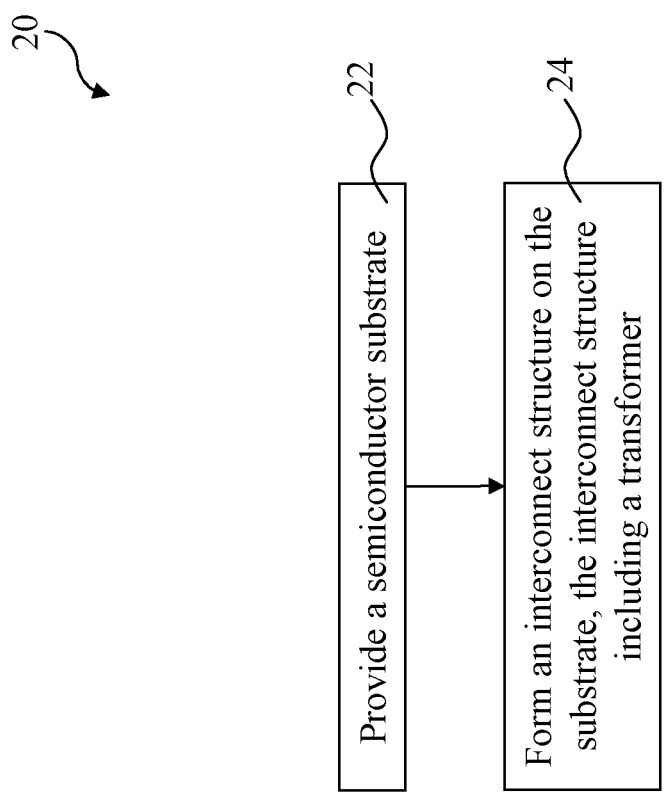
FIG. 1 is a flowchart of method to fabricate a semiconductor device having a transformer with capacitive coupling features in one or more embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
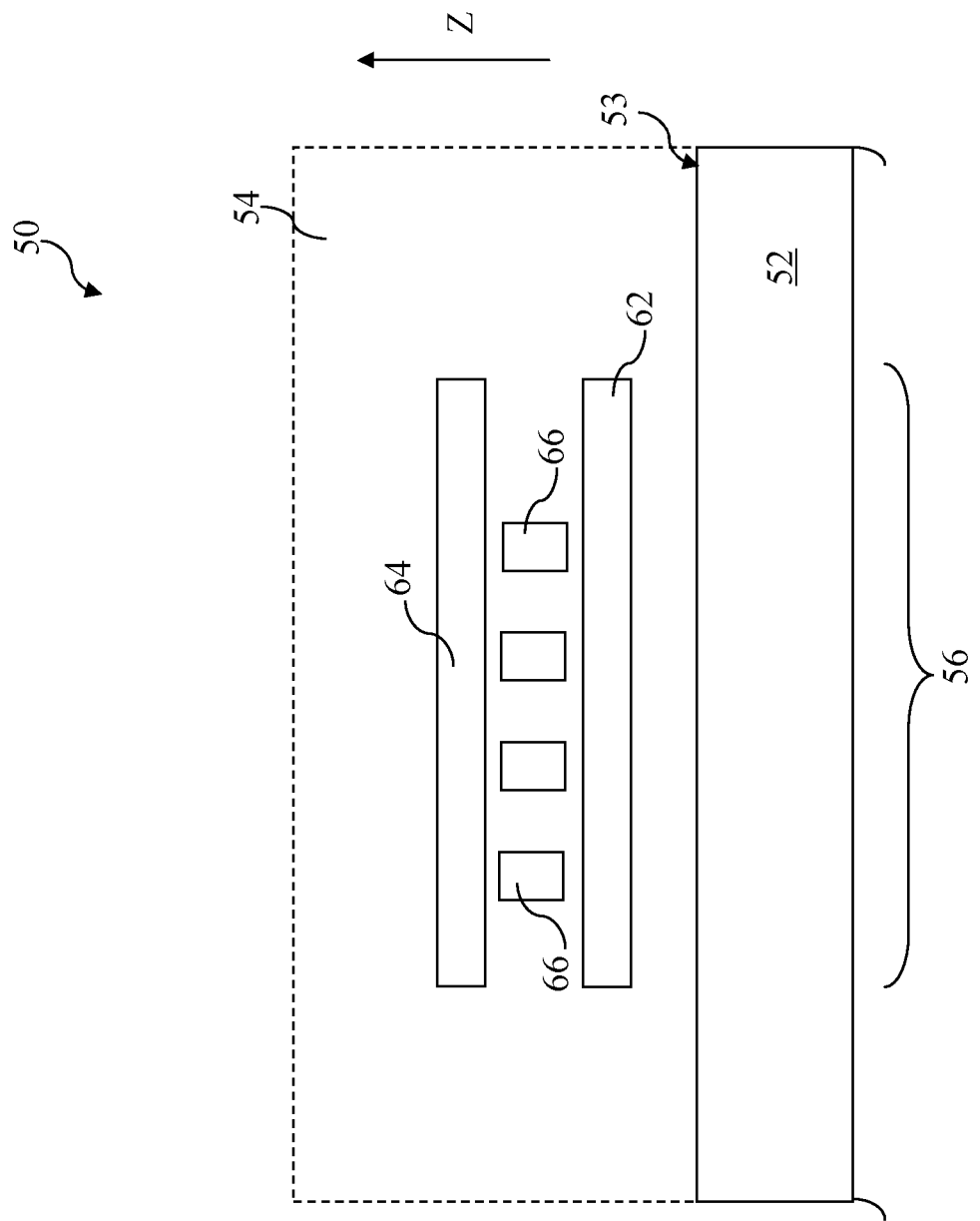
FIG. 2 is a sectional view of a semiconductor device having a transformer integrated with magnetic features constructed according to aspects of the present disclosure in one or more embodiments.

Illustrated in FIG. 1 is a flowchart of a method 20 for fabricating a semiconductor device that includes a transformer structure. FIG. 2 is a schematic view of a semiconductor structure 50 having a transformer integrated with one or more magnetic features constructed according to aspects of the present disclosure in other embodiments. The semiconductor structure 50 and the method 20 are collectively described below with reference to FIGS. 1 and 2.

The semiconductor structure 50 may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

The method 20 begins with block 22 in which a substrate 52 is provided. The substrate 52 includes a surface 53 that defines an axis "Z" perpendicular to the surface 53. The substrate 52 may include a semiconductor substrate, such as silicon substrate, or other suitable substrate. Alternatively or additionally, the substrate 52 includes germanium, silicon germanium or other proper semiconductor materials. The substrate 52 also includes various isolation features, such as shallow trench isolation (STI), formed in the substrate to separate various devices. The semiconductor substrate also includes various doped regions such as n-well, p-wells, light doped drain (LDD) features and heavily doped source and drain (S/D) features. Those doped features and other features (e.g., gate electrode) are configured to form various active and passive devices. Various devices may be formed on the substrate 52, such as field effect transistors (FETs). In one example, the FETs includes complementary metal-oxide-semiconductor FETs (CMOSFETs) that have n-type FETs and p-type FETs integrated into a functional circuit.

The method 20 continues with block 24 in which an interconnect structure 54 is formed on the substrate 52. The interconnect structure 54 includes a plurality of conductive lines interconnected by a plurality of vias (or via features). Particularly, the interconnect structure includes multiple metal layers, such as metal one $M_1$, metal two $M_2$ and so on. The metal layers are perpendicular to the axis Z. The plurality of conductive lines belong to respective metal layers. The conductive lines (metal lines) and via features are configured to provide horizontal and vertical routings, respectively. The conductive lines and via features are couple with the various devices on the substrate, forming one or more functional circuits. Furthermore, the interconnect structure is designed to provide electrical routings between the devices and input/output signals.

In another embodiment, each of the metal lines and via features further includes a barrier layer and bulk metal where the barrier layer is disposed to separate the bulk metal from the adjacent dielectric material. In one example, the barrier layer includes titanium nitride, tantalum nitride or other suitable material to prevent inter-diffusion between the bulk metal and the dielectric material. In another example, the bulk metal includes copper, aluminum (or aluminum copper alloy), tungsten or other suitable metal. In yet another example, the dielectric material includes silicon oxide, low k dielectric material or other dielectric material to provide isolation among various metal lines and via features.

The interconnect structure 54 is formed in a manner such that a transformer 56 is formed in the interconnect structure. The transformer 56 is formed with at least some of the conductive lines and at least some of the vias of the interconnect structure 54. In one embodiment, the transformer includes a first inductor 62 and a second inductor 64 configured to be inductively coupled. Particularly, the first inductor 62 includes a first coil element and the second inductor 64 includes a second coil element. The first inductor 62 further includes first two ports extended from the first coil element and connected to one of input/output signals. Similarly, the second inductor 64 includes second two ports connected with another one of input/output signals. One of the first inductor 62 and second inductor 64 is configured as a primary coil of the transformer 56 and the another is configured as a secondary coil.

The transformer 56 defines a mutual inductance M between the first and second inductors 62 and 64. A coupling coefficient K is defined to the transformer as well. The coupling coefficient K ranges between 0 and 1. The mutual inductance is related to the coupling coefficient K. In one example wherein the transformer 56 only includes the first and second inductors 62 and 64, the mutual inductance M is related to the coupling coefficient K defined by $M=K(L1*L2)^{1/2}$, wherein L1 is the self-inductance of the first coil element and L2 is the self-inductance of the second coil element.

The transformer 56 further includes one or more magnetic feature 66 disposed approximate the first and second inductors (62 and 64). The magnetic feature 66 is configured to enhance the inductive coupling between the first and second inductors 62 and 64. The magnetic feature 66 includes a magnetic material having a relative permeability substantially greater than one. In embodiment, the magnetic feature 66 includes nickel. In other embodiments, the magnetic feature 66 includes nickel nitride or nickel silicide. In yet another embodiment, the magnetic features 66 includes a magnetic material selected from the group consisting of nickel, cobalt, iron, proper alloys thereof and combinations thereof. The magnetic feature 66 may be formed using suitable technologies, such as physical vapor deposition (PVD) or plating. In a particular example, the magnetic feature 66 is neither electrically connected with the first inductor 62 nor the second inductor 64.

Figure 3C:
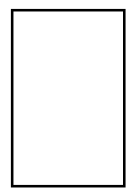
FIGS. 3b, 3c, 3d and 3e are top views of the magnetic feature of FIG. 3a constructed according to various embodiments.
Figure 3B:
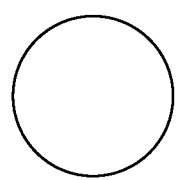
Figure 3A:
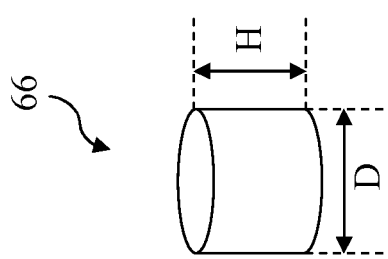
FIG. 3a is a perspective view of a magnetic feature of FIG. 2 constructed according to aspects of the present disclosure in other embodiments.
Figure 3E:
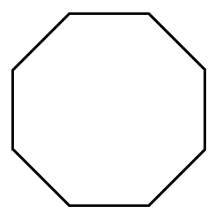
Figure 3D:
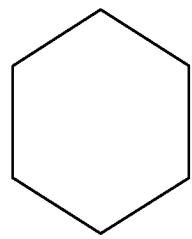

The magnetic feature 66 may be designed with a suitable shape. FIG. 3a illustrates a perspective view of the magnetic feature 66 in one embodiment. The magnetic feature 66 includes a height H and diameter D. The height H is defined in a direction Z perpendicular to the substrate surface 53 while the diameter D is defined as a horizontal dimension of the magnetic feature 66 in a direction parallel with the substrate surface 53. The magnetic feature 66 may include ball, column or other suitable geometries. In one embodiment, the height H of the magnetic feature 66 is substantially greater than the diameter D thereof. In a top view toward the substrate surface 53, the magnetic feature 66 may have a shape as round, rectangle, hexagon, or pentagon such as those illustrated in FIGS. 3b through 3e according to various embodiments.

In one embodiment, the magnetic feature 66 is configured between the first and second inductors 62 and 64 but is not electrically connected to the first and second inductors 62 and 64. In one example, the plurality of magnetic features 66 are configured in a circle aligned with the first and second coil elements. In another example, the plurality of magnetic features 66 are configured in a segment of the circle aligned with the first and second coil elements. In yet another example, the plurality of magnetic features 66 are configured in a region aligned with a central region surrounded by the first and second coil elements. FIG. 4 illustrate one embodiment of the transformer 56 in a top view. The first inductor 62 and the second inductors 64 are disposed in a same region of the substrate 52. The corresponding coil elements are configured in a ring region that surrounds a central region. The plurality of magnetic features 66 are configured in the ring region to enhance the inductive coupling between the first and second inductors. The coil elements consist metal lines. In one embodiment, when the metal lines have a width W as illustrated in FIG. 4, the diameter D of the magnetic features is greater than the width of the metal lines. In one example, a ratio D/W ranges between about 5 and about 20.

As noted above, the interconnect structure 54 includes a plurality of metal layers patterned as metal lines to provide horizontal connection. Via features are configured to provide vertical connection between neighbor metal layers. Various via features between two neighbor metal layers are referred to as via features in a via layer. In one embodiment, the first inductor 62 is formed in one or more metal layers. The second inductor 64 is underlying the first inductor and is formed in one or two other metal layer. The magnetic features 66 are formed in a via layer, a metal layer or more metal layers including the via layers connecting the metal layers.

In another embodiment, the first and second inductors 62 and 64 are integrated in one or more metal layers and are approximate from each other such that the mutual inductance is enhanced. In one example, the first and second inductors 62 and 64 are disposed in two approximate metal layers. Each may include metal lines in the two metal layers and via features between the two metal layers. In furtherance of the embodiment, the first coil element is configured in one metal layer and the second coil element is configured in another metal layer. The first and second ports are distributed on the two metal layers and are connected to the corresponding coil element by via features. Particularly, the magnetic features 66 are formed in the via layer between the two approximate metal layers. However, the magnetic features 66 include a magnetic material and are not electrically connected with the first and second inductors. Particularly, the magnetic features 66 are distributed in a configuration for enhanced coupling between the first and second inductors.

In one embodiment to form the magnetic features 66, a similar method to form via features are used, such as by a damascene method. To prevent the direct contact with the first and second inductors, the via features are configured to be offset from the metal lines of the first and second inductors. In another embodiment, a modified damascene process is utilized to form the magnetic features 66 such that the top surface of the magnetic features is below the overlying metal lines and the bottom surface of the magnetic features is above the underlying metal lines. For example, via holes are formed in an interlayer dielectric layer to expose the underlying metal lines. A first dielectric layer is then deposited on the interlayer dielectric layer and the via holes to cover the exposed metal lines. The magnetic material is disposed on the via holes and a chemical mechanical polishing (CMP) process may be followed to remove the excessive magnetic material on the interlayer dielectric material. Then a second dielectric material layer is disposed on the interlayer dielectric material and covers the magnetic features formed in the via holes. In another embodiment where the magnetic features and via features (for vertical connection) are formed in the same via layer, the magnetic features and the via features are separately formed by a procedure including lithography patterning. For example, the first dielectric material layer is only deposited in the via holes for magnetic features while the via holes for via features are covered by a patterned photoresist layer. In another example, the first dielectric material layer is disposed and is then patterned to remove the portion on the via holes for the via features. Similarly, the second dielectric material is disposed only in the region of the magnetic features.

Although not specifically shown for the sake of simplicity, the interconnect structure 54 further includes one or more dielectric material layers such that the various metal features (metal lines and via features) are embedded in. The dielectric material layers provide isolation function to the interconnect structure. The dielectric material layers may include silicon oxide, silicon nitride, silicon oxy-nitride, un-doped silicate (USG), fluoride-doped silicate (FSG), and/or a low-k dielectric material. The various interconnection features may implement various conductive materials including copper, tungsten, aluminum or silicide. In one example, a damascene process is used to form copper related interconnect structure. In another example, a metal etch process may be used to form aluminum related interconnect structure.

Figure 5:
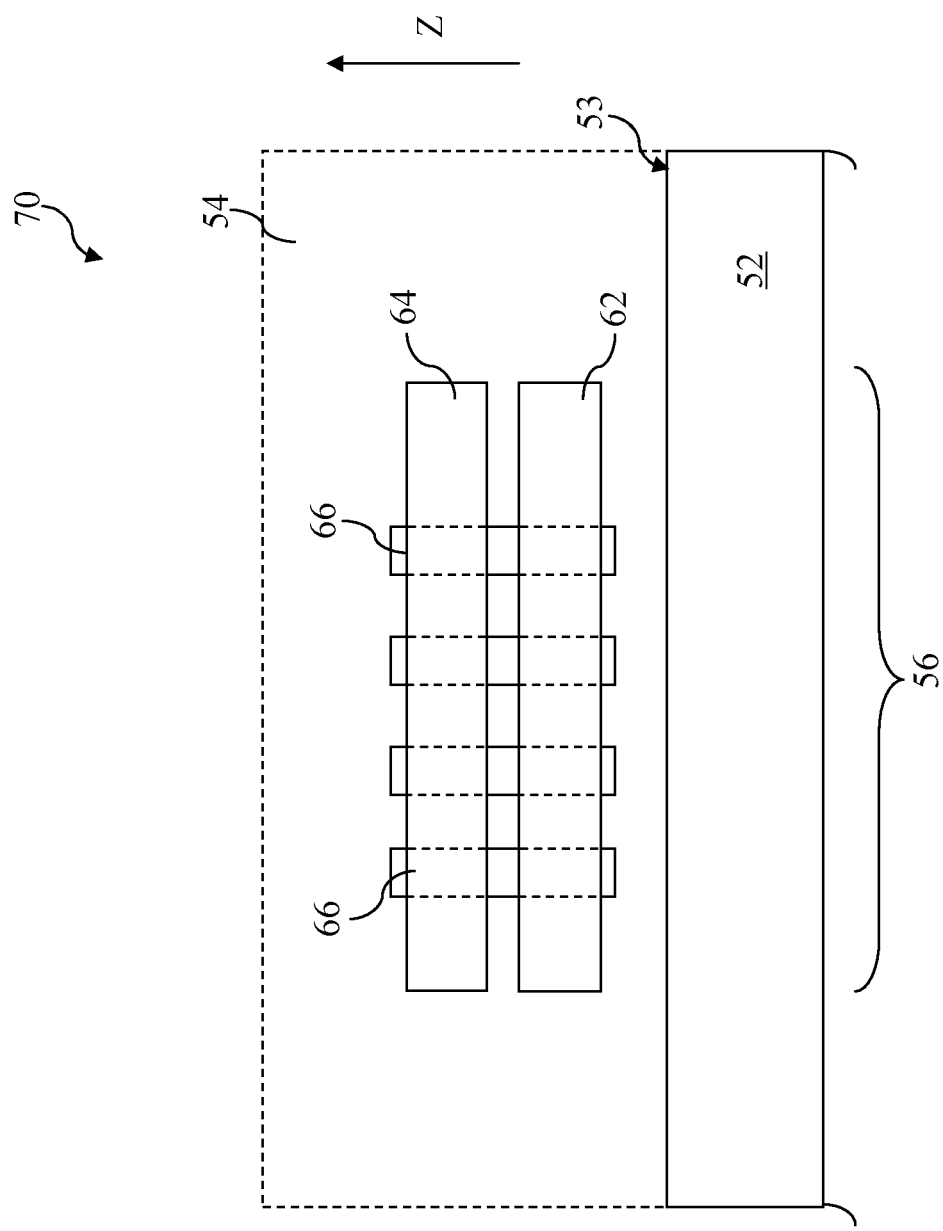
FIG. 5 is a sectional view of a semiconductor device having a transformer integrated with magnetic features constructed according to aspects of the present disclosure in one or more other embodiments.
Figure 6:
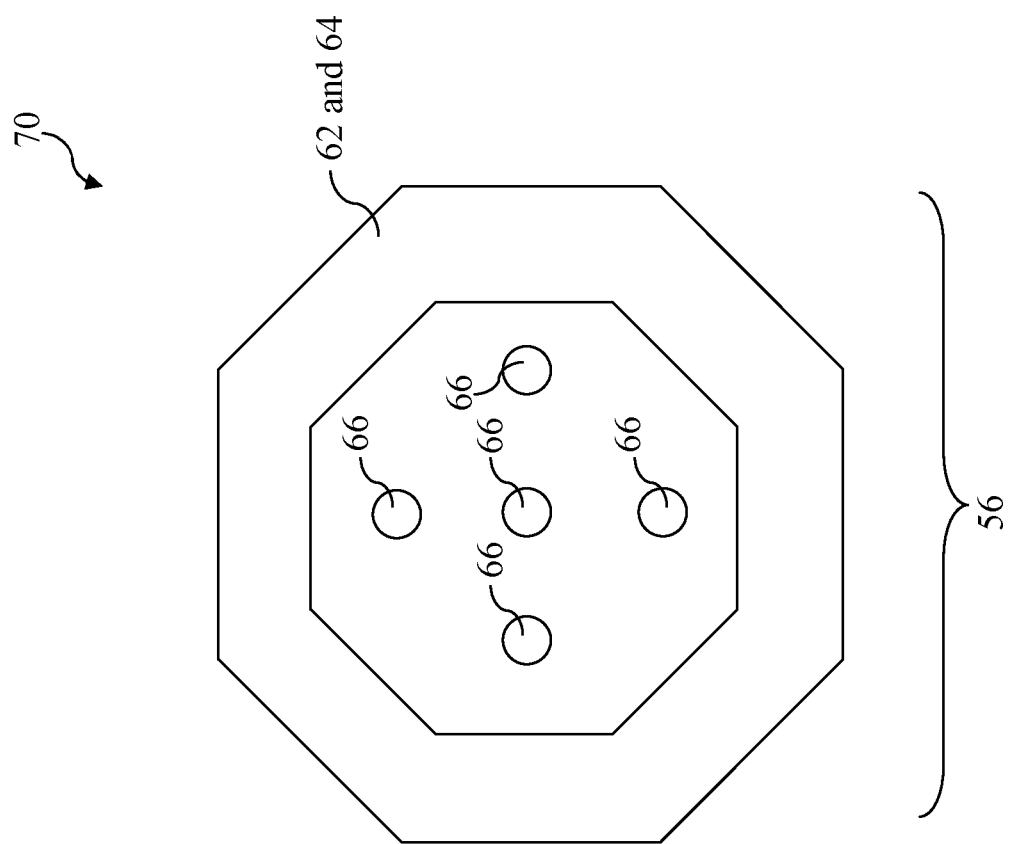
FIG. 6 is a top view of a transformer integrated with a plurality of magnetic features constructed according to various aspects of the present disclosure in another embodiment.

Various embodiments of the transformer are illustrated below with reference to respective figures and further described. FIG. 5 is a sectional view of a semiconductor device 70 having a transformer constructed according to various aspects in one or more embodiments. FIG. 6 is a fragmental top view of the semiconductor device 70. The semiconductor device 70 includes a transformer 56 integrated in the interconnect structure 54. In the depicted embodiment, the interconnect structure 54 includes a plurality of metal layers.

The transformer 56 includes a first conductive feature 62 and a second conductive feature 64 configured to be inductively coupled. The first inductor 62 includes a first coil element. Each of the first and second inductors further includes first two ports extended from the first coil element and connected with one of input/output signals. Particularly, the coil elements of the first inductor 62 and the second inductor 64 are formed in a ring region surrounding a central region. The magnetic features 66 are disposed in the central region and are surrounded by the first and second inductors as illustrated in FIG. 6. In one example, the magnetic features 66 are vertically extended from the first inductor 62 to the second inductor 64. The magnetic features 66 may be shaped and sized similar to the magnetic features 66 of the transformer 56 of FIG. 2.

Figure 7:
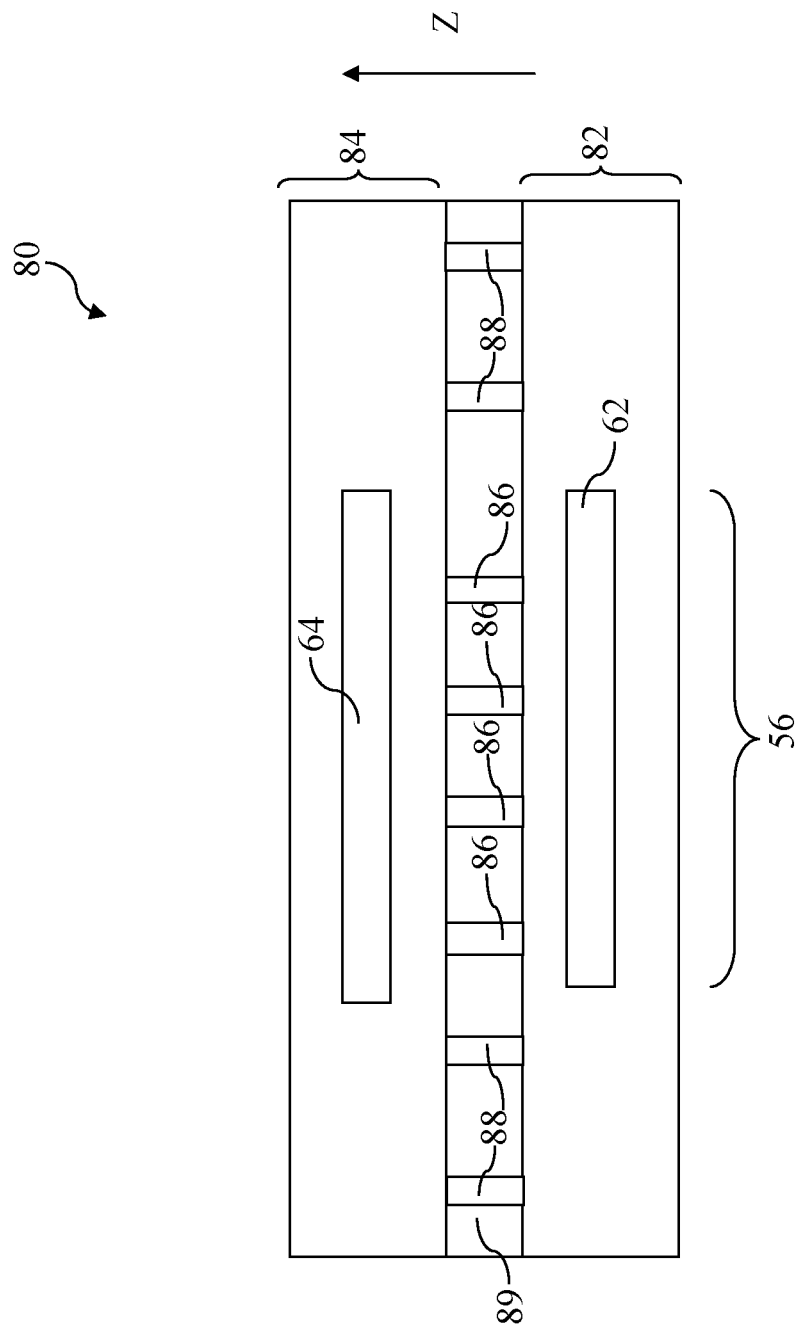
FIG. 7 is a sectional view of a semiconductor device having a transformer integrated with magnetic features constructed according to aspects of the present disclosure in another embodiment.

FIG. 7 is a sectional view of an integrated circuit structure 80 having a transformer constructed according to aspects of the present disclosure in another embodiment. The integrated circuit device 80 includes a first substrate 82 and a second substrate 84 stacked and bonded together. In one embodiment, the first substrate 82 is an integrated circuit chip and the second substrate 84 is an interposer configured between the first substrate and a third substrate (such as another integrated circuit chip) for chip-stacking in three dimensional integrated circuit structure. Particularly, the first substrate 82 is attached to a first side of the interposer 84 and a third substrate (not shown) is attached to a second side of the interposer 84.

An transformer 56 is formed in the integrated circuit structure 80. The transformer 56 includes a first inductor 62 formed on the first substrate 82. In the present embodiment, an interconnect structure is formed on the first substrate 82 and the first inductor 62 is integrated in the interconnect structure of the first substrate 82. For example, the first inductor 62 is distributed in one or more metal layers in the interconnect structure. The first inductor 62 is similar to the first inductor 62 of FIG. 2 in term of structure according to one embodiment. In other examples, the first substrate 82 may include silicon or other semiconductor material. Various devices, such as field effect transistors, are formed on the first substrate 82 and are coupled through the interconnect structure.

The transformer 56 includes a second inductor 64 formed on the second substrate 84 as an interposer in the present embodiment. The second inductor 64 is formed in the interposer 84. The second inductor 64 is substantially aligned with the first inductor 62, in a top view, for a proper inductive coupling between the first and second inductors. In the present embodiment, the interposer includes conductive features and the second inductor 64 is integrated in the conductive features of the interposer. In one example, the interposer 84 includes a substrate and a plurality of through-substrate-vias (TSVs) formed in the substrate to provide electrical interconnection. In one embodiment, the substrate of the interposer 84 is a silicon substrate. In this case, the through substrate vias may also be referred to as through silicon vias.

The second inductor 64 is integrated in the TSVs. In another example, the interposer 84 includes metal traces formed in a surface layer of the interposer for bonding and electrical interconnection. The second inductor 64 is integrated with the metal traces. The second substrate 84 may include silicon or other material.

The transformer 56 also includes one or more magnetic features 86 disposed between the first inductor 62 and the second inductor 64. The magnetic features 86 are configured to be aligned with the first inductor 62 and second inductor 64 in a same region such that the inductive coupling between the first and second inductors is enhanced. Particularly, the magnetic features 86 are sandwiched between the first inductor 62 and the second inductor 64. In the present embodiment, the magnetic features 86 are neither electrically connected with the first inductor 62 nor the second inductor 64. In one example, the magnetic features 86 are configured in a ring region aligned with the corresponding coil elements of the first and second inductors. The magnetic features 86 are similar to the magnetic features 66 in term of composition according to one embodiment. The magnetic features 86 include a magnetic material having a relative permeability substantially greater than one. For example, the magnetic features 86 include nickel, cobalt or iron. In another example, the magnetic features 86 include nickel nitride or nickel silicide.

The magnetic features 86 may be shaped to ball, column or other suitable geometries. In one embodiment, the height of the magnetic features 86 is substantially greater than the diameter thereof. In a top view, the magnetic features 86 may have a shape as round, rectangle, hexagon, or pentagon such as those illustrated in FIGS. 3b through 3e according to various embodiments. In another embodiment, when the inductors include metal lines of a width W, the diameter D of the magnetic features is greater than the width of the metal lines. In one example, a ratio D/W ranges between about 5 and about 20.

The first substrate 82 and the interposer 84 are bonded together through a plurality of conductive bumps 88. The conductive bumps 88 provide a bonding mechanism between the first substrate 82 and the substrate 84 (the interposer in the present embodiment). The conductive bumps 88 also provide electric routing between the first and second substrates through. In the present embodiment, the magnetic features 86 are integrated with the conductive bumps 88, collectively referred to as micro-bumps. Therefore the magnetic features 86 are at least a subset of the micro-bumps. However, the magnetic features 86 have a relative permeability substantially greater than one. In one embodiment, the magnetic features 86 include a first material and the conductive bumps include a second material different from the first material. The first material is chosen for higher permeability and the second material is chosen for bonding effect and electrical interconnection. In another embodiment, the magnetic features 86 and the conductive bumps include a same material tuned for higher permeability, bonding effect and electric interconnection.

In one embodiment, various bonding features are respectively formed on the first and second substrates (82 and 84). Then the first and second substrates are aligned and positioned together such that the corresponding bonding surfaces face each other and the respective bonding features are physically contacted and merged together to the micro-bumps through proper bonding mechanism, such as thermal effect and mechanical effect. The conductive bumps 88 provide electrical routing and mechanical bonding through metal traces formed on the first and second substrates according to one embodiment. Then an under-fill material 89 is disposed into the space between the first substrate 82 and the second substrate 84 for proper packaging effect, such as bonding, sealing and/or insulation. The under-fill material 89 includes a suitable dielectric material, such as a polymeric material for the packaging effect. In the present embodiment, the micro-bumps including the magnetic features 86 are embedded in the under-fill material. In one example, the under-fill material 89 has a thickness greater than about 10 micron. In another example, the under-fill material 89 has a thickness ranging between about 20 micron and about 50 micron.

Figure 8:
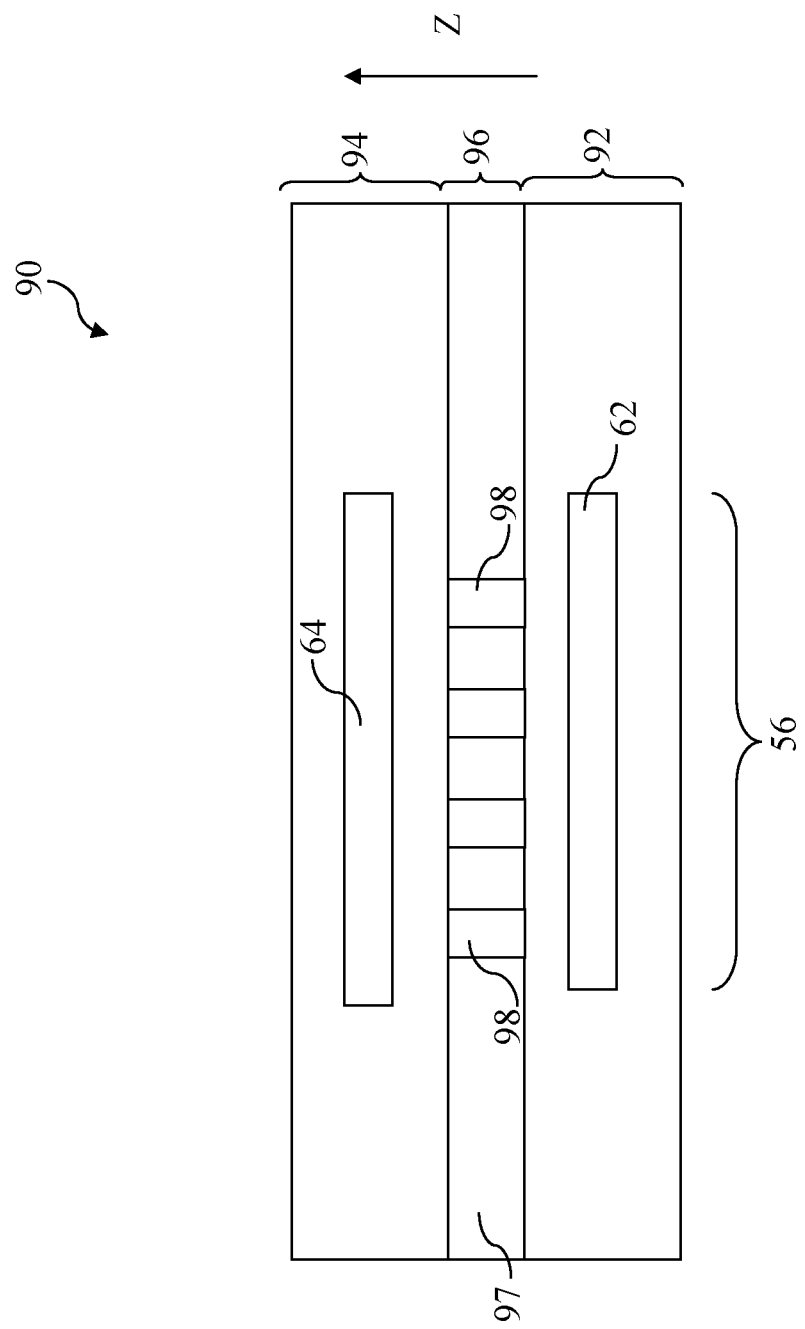
FIG. 8 is a sectional view of a semiconductor device having a transformer integrated with magnetic features constructed according to aspects of the present disclosure in another embodiment.

In another embodiment, FIG. 8 is a sectional view of an integrated circuit structure 90 having a transformer constructed according to aspects of the present disclosure in another embodiment. The integrated circuit device 90 includes a first substrate 92 and a second substrate 94 attached into an interposer 96. Particularly, the first substrate 92 is attached to a first side of the interposer 96 and the second substrate 94 is attached to a second side of the interposer 96 through conductive bumps formed on the corresponding bonding surfaces. In the present embodiment, the first substrate 92 is a first integrated circuit die and the second substrate 94 is a second integrated circuit die. The interposer 96 includes a plurality of conductive features embedded in a substrate, such as a dielectric substrate or a silicon substrate.

An transformer 56 is formed in the integrated circuit structure 90. The transformer 56 includes a first inductor 62 formed on the first substrate 92. In the present embodiment, a first interconnect structure is formed on the first substrate 92 and the first inductor 62 is integrated in the first interconnect structure. For example, the first inductor 62 is distributed in one or more metal layers of the first interconnect structure. The first inductor 62 is similar to the first inductor 62 of FIG. 2 in term of structure according to one embodiment. The first substrate 92 may include silicon or other semiconductor material. Various devices, such as field effect transistors, may be formed on the first substrate 82.

The transformer 56 includes a second inductor 64 formed on the second substrate 94. The second inductor 64 is substantially aligned with the first inductor 62, in a top view, to achieve a proper inductive coupling between the first and second inductors. In the present embodiment, a second interconnect structure is formed on the second substrate 94 and the second inductor 64 is integrated in the second interconnect structure. For example, the second inductor 64 is distributed in one or more metal layers of the second interconnect structure. The second inductor 64 is similar to the second inductor 64 of FIG. 2 in term of structure according to one embodiment. The second substrate 94 may include silicon or other semiconductor material. Various devices, such as field effect transistors, may be formed on the second substrate 94.

The transformer 56 also includes one or more magnetic features 98 embedded in the interposer 96. The magnetic features 98 are configured to be aligned with the first inductor 62 and second inductor 64 in a same region such that the inductive coupling between the first and second inductors is enhanced. Particularly, the magnetic features 98 are sandwiched between the first inductor 62 and the second inductor 64. In the present embodiment, the magnetic features 98 are neither electrically connected with the first inductor 62 nor the second inductor 64.

The magnetic features 98 may be shaped to ball, column or other suitable geometries. In one embodiment, the height of the magnetic features 98 is substantially greater than the diameter thereof. In a top view, the magnetic features 98 may have a shape as round, rectangle, hexagon, or pentagon such as those illustrated in FIGS. 3b through 3e according to various embodiments. In another embodiment, when the inductors include metal lines of a width W, the diameter D of the magnetic features is greater than the width of the metal lines. In one example, a ratio D/W ranges between about 5 and about 20.

In one example, the magnetic features 98 are configured in a ring region aligned with the corresponding coil elements of the first and second inductors. The magnetic features 98 are similar to the magnetic features 66 in term of composition according to one embodiment. The magnetic features 98 include a magnetic material having a relative permeability substantially greater than one. For example, the magnetic features 98 include nickel, cobalt or iron. In another example, the magnetic features 98 include nickel nitride or nickel silicide.

The interposer 96 includes a plurality of conductive bumps embedded in a substrate of a dielectric material or other suitable material, such as a silicon substrate. The interposer 96 provides an interface to bond the first and second substrates and provides an electric routing between the first and second substrates through the conductive features, such as through substrate vias (TSVs). The TSVs include one or more conductive material formed by substrate etch and deposition. In the present embodiment, the magnetic features 98 are integrated with the TSVs. However, the magnetic features 98 have a relative permeability substantially greater than one. In one embodiment, the magnetic features 98 include a magnetic material for inductive coupling enhancement and the magnetic material is different from the conductive material (such as metal) of TSVs in composition. The magnetic material is chosen for higher permeability and the conductive material is chosen for bonding effect and electrical interconnection. In another embodiment, the magnetic features 98 and the TSVs include a same material tuned for higher permeability, bonding effect and electric interconnection.

Various embodiments of the transformer are provided according to the aspects of the present disclosure, such as the transformer 56 in the integrated circuit structure 80 or 90. Various advantages may present in different embodiments. In addition to utilizing magnetic features in the transformer, the spacing between the magnetic features and first inductor 62 (or the second inductor 64) has a large tunable range to optimize different parameters of the transformer, including inductive coupling, quality factor, and/or frequency in one or more embodiments.

Figure 9:
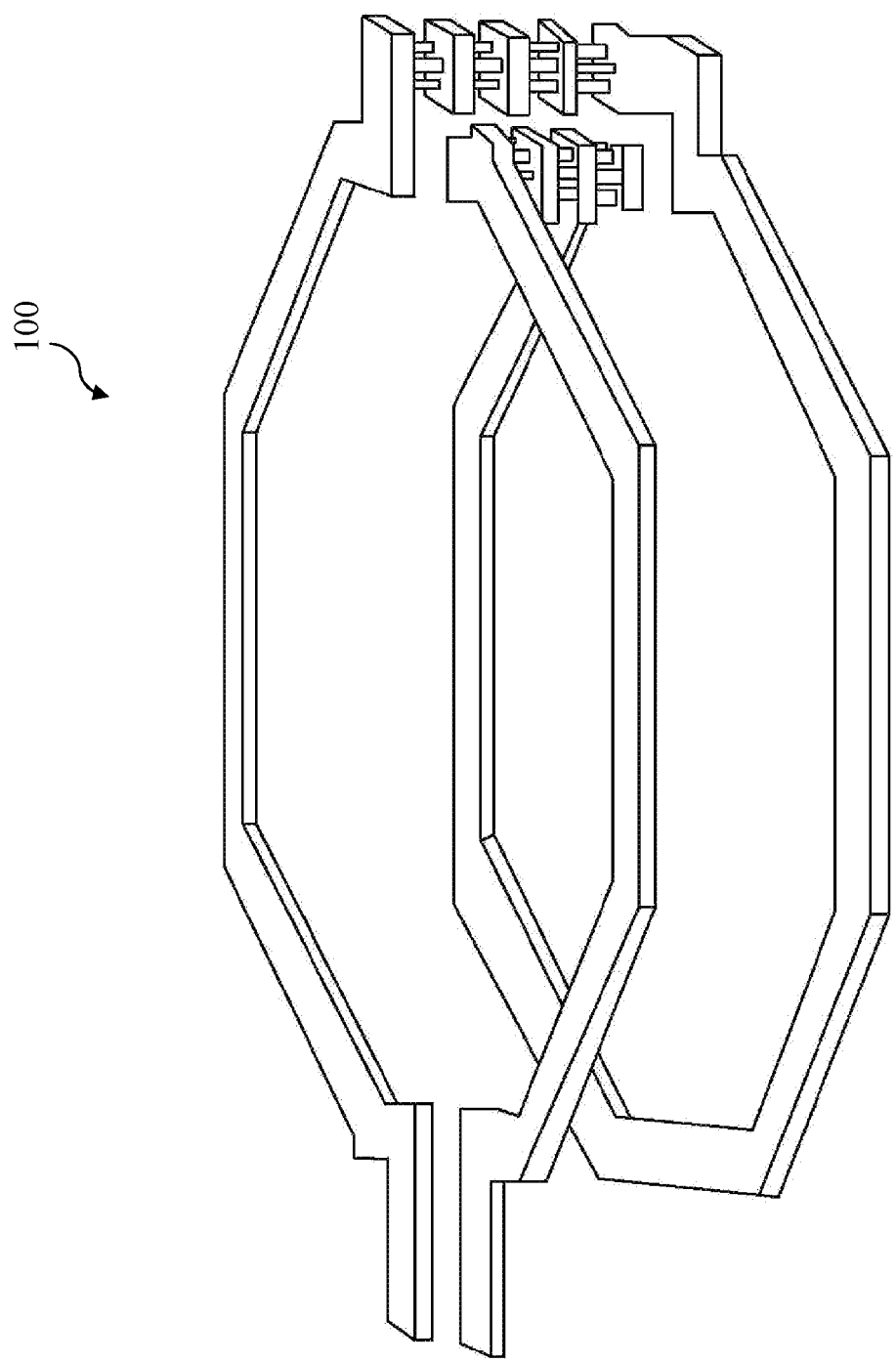
FIG. 9 is a perspective view of an inductor constructed according to aspects of the present disclosure in another embodiment.

FIG. 9 is a perspective view of inductor 100 constructed according to aspects of the present disclosure. The inductor 100 include a coil element having one or more turns (e.g., two turns in the present example). Various turns of the coil element are connected through via features in the metal layer in one embodiment. In one embodiment, the first coil element includes a first spiral structure disposed in a first plurality of metal layers and the second coil element includes a second spiral structure disposed in a second plurality of metal layers over the first plurality of metal layers. The magnetic features are formed in the first and second plurality of metal layers and are extended through the first and second spiral structures. The inductor 100 may be integrated in the transformer 56 of FIG. 2, 70 of FIG. 5, 80 of FIG. 7, or 90 of FIG. 8 as the first inductor 62 and/or the second inductor 64.

Figure 10:
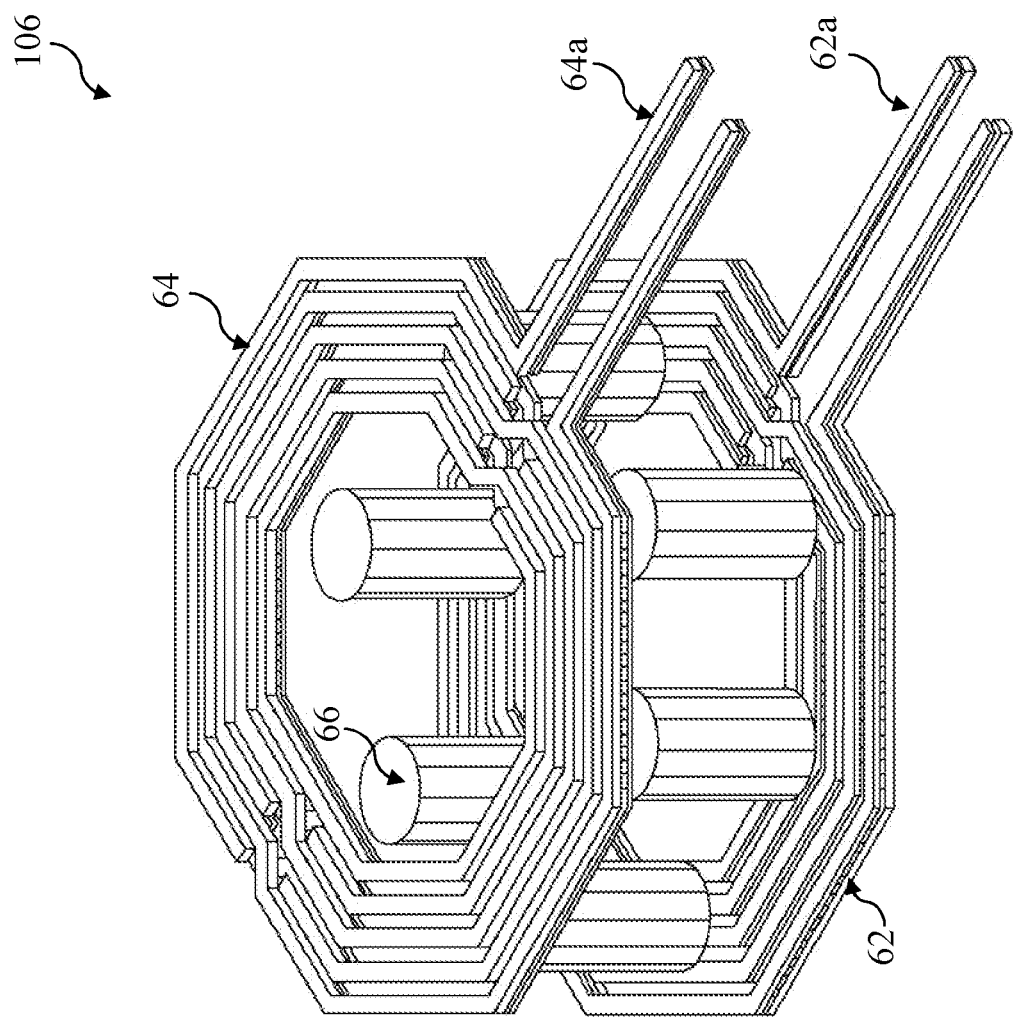
FIGS. 10 and 11 are perspective views of a transformer integrated with a plurality of magnetic features constructed according to various aspects of the present disclosure in various embodiments.

FIG. 10 is a perspective view of transformer 106 constructed according to aspects of the present disclosure. The transformer 106 include a first inductor 62 having a first coil element connected to first ports 62a. The transformer 106 include a second inductor 64 having a second coil element connected to second ports 64a. The first and second inductors are positioned in a same region and aligned for inductive coupling. Various magnetic features 66 are sandwiched between the first and second inductors. The magnetic features 66 are configured in a ring region aligned with the coil elements of the first and second inductors. The transformer 106 is one embodiment of the transformer 56 in FIG. 2, 70 of FIG. 5, 80 of FIG. 7, or 90 of FIG. 8.

Figure 11:
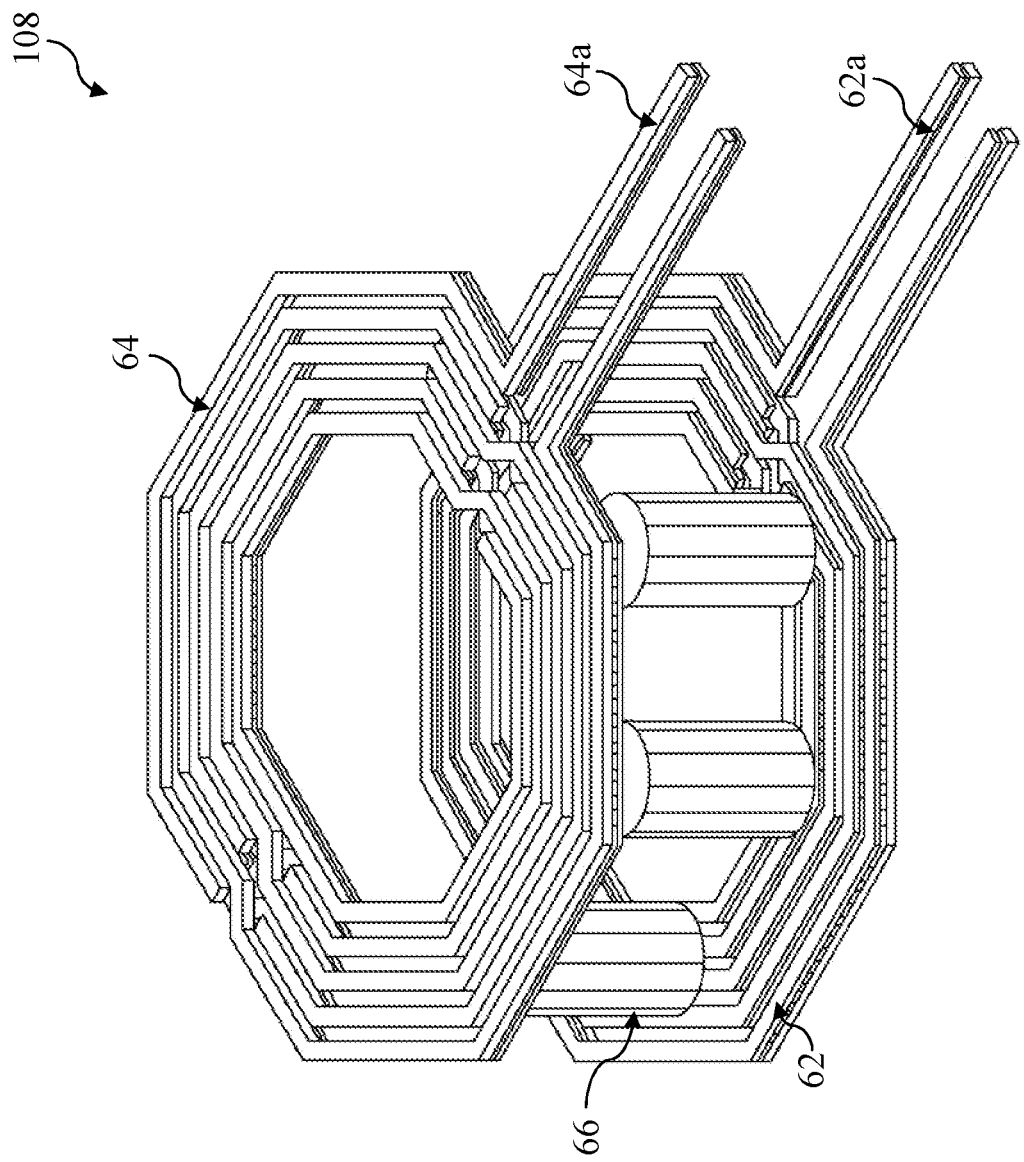

FIG. 11 is a perspective view of transformer 108 constructed according to aspects of the present disclosure. The transformer 108 include a first inductor 62 having a first coil element connected to first ports 62a. The transformer 106 include a second inductor 64 having a second coil element connected to second ports 64a. The first and second inductors are positioned in a same region and aligned for inductive coupling. Various magnetic features 66 are sandwiched between the first and second inductors. The magnetic features 66 are configured in a segment of the ring region aligned with the coil elements of the first and second inductors. The transformer 108 is one embodiment of the transformer 56 in FIG. 2, 70 of FIG. 5, 80 of FIG. 7, or 90 of FIG. 8.

Although embodiments of the present disclosure have been described in detail, those skilled in the art should understand that they may make various changes, substitutions and alterations herein without departing from the spirit and scope of the present disclosure. For example, the transformer is integrated with a 3D stacking structure having a first die, a second die and a third die sandwiched between the first and second dice. The transformer includes a first inductor integrated in the first die and a second inductor integrated in the second die. The transformer further includes one or more magnetic features integrated in the third die.

The present disclosure is not limited to any particular application. For example, the disclosed structure of a transformer and method making the same may be used in any radio frequency integrated circuit (RFIC) applications, such as voltage controlled oscillator (VCO), low noise amplifier (LNA), impedance matching network or mixer. In another example, the integrated circuit structure (or semiconductor structure) integrated with a transformer having the magnetic features may additionally include other structure, such as a dynamic random access second (DRAM) cell, field programmable gate-array (FPGA) and/or other microelectronic devices (collectively referred to herein as microelectronic devices). Of course, aspects of the present disclosure may be employed in many different applications, including sensor cells, logic cells, electrostatic discharge ESD circuit application, interconnection with antenna and others.

In various embodiments of a transformer integrated in an integrated circuit structure (or a semiconductor structure), the transformer includes two inductors inductively coupled and further includes one or more magnetic features integrated with the first and second inductors to provide enhanced coupling to the transformer. Various advantages may be present in different examples or embodiments. In one example, spacing between the first inductor (or the second inductor) and the magnetic features is tunable a large range since the distance between the dice is larger and each inductor can be formed in a lower portion or an upper portion of the corresponding substrate according specific application and design need.

A semiconductor device is disclosed according to one of the broader forms of the present disclosure. In one embodiment, the semiconductor device includes a first inductor formed on a first substrate; a second inductor formed on a second substrate and conductively coupled with the first inductor as a transformer; and a plurality of micro-bump features configured between the first and second substrates. The plurality of micro-bump features include a magnetic material having a relative permeability substantially greater than one and are configured to enhance coupling between the first and second inductors.

In one embodiment of the disclosed semiconductor device, the first substrate includes a semiconductor substrate having an integrated circuit formed thereon; and the second substrate includes is an interposer bonded to the first substrate. In another embodiment, the interposer includes a silicon substrate having through-silicon vias.

In yet another embodiment, the micro-bump features are electrically disconnected from the first inductor and the second inductor.

In yet another embodiment, the semiconductor device further includes a dielectric under-fill material disposed between the first and second substrates such that the plurality of micro-bump features are embedded in the under-fill material. In yet another embodiment, the magnetic material includes one of nickel, cobalt and iron. In yet another embodiment, the magnetic material is selected from the group consisting of nickel, nickel nitride, and nickel silicide. In yet another embodiment, the micro-bump features are shaped to have a diameter and a height greater than the diameter.

The present disclosure also provides another embodiment of a semiconductor device. The semiconductor structure includes a semiconductor substrate having an integrated circuit (IC) device; an interconnect structure disposed on the semiconductor substrate and coupled with the IC device; and a transformer disposed on the semiconductor substrate and integrated in the interconnect structure. The transformer includes a first inductor, a second inductor conductively coupled with the first inductor, and a magnetic feature that is disposed approximate the first and second inductors and is configured to enhance inductive coupling between the first and second inductors.

In one embodiment of the disclosed semiconductor device, the magnetic feature includes a magnetic material having a relative permeability substantially greater than one. In another embodiment, the magnetic feature includes a magnetic material selected from the group consisting of nickel, iron, cobalt, or combinations thereof. In yet another embodiment, the magnetic feature is configured between the first and second inductors and is not electrically connected to the first and second inductors.

In yet another embodiment, the interconnect structure includes a plurality of metal layers having a first metal layer, a second metal layer and a via layer disposed therebetween; the first inductor is disposed in the first metal layer; the second inductor is disposed in the second metal layer; and the magnetic feature is disposed in the via layer.

In yet another embodiment, the magnetic feature includes a plurality of sub-features separated and distributed between the first and second inductors.

In yet another embodiment, the semiconductor substrate has a top surface; each of the sub-features of the magnetic feature has a dimension D in a top view toward to top surface; and each of the first and second inductors includes a metal line with a width W, wherein a ratio D/W ranges between about 5 and about 20.

In yet another embodiment, the first inductor includes a first spiral structure disposed in a first plurality of metal layers; the second inductor includes a second spiral structure disposed in a second plurality of metal layers over the first plurality of metal layers; and the magnetic feature is formed in the first and second plurality of metal layers and is extended through the first and second spiral structures. In yet another embodiment, each of the first and second inductors includes multiple turns.

The present disclosure also provides another embodiment of an integrated circuit (IC) structure. The IC structure includes a first substrate having a first inductor; a second substrate having a second inductor configured to couple with the first inductor as a transformer; a through substrate via (TSV) interposer bonded between the first and second substrates and having a plurality of via features embedded therein; and at least a subset of the via features being configured approximate the first and second inductors and including a magnetic material with a relative permeability substantially greater than one.

In one embodiment, the subset of via features are configured to be electrically disconnected from the first and second inductors. In another embodiment, the magnetic material is selected from the group consisting of nickel, cobalt, iron and combinations thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first inductor formed on a first substrate;
   a second inductor formed on a second substrate and conductively coupled with the first inductor as a transformer;
   a plurality of bump features configured between the first and second substrates, wherein the plurality of bump features include a magnetic material having a relative permeability substantially greater than one and are configured to enhance coupling between the first and second inductors; and
   a plurality of vias configured between the first and second substrates and integrated with the plurality of bump features such that at least one via from plurality of vias interposes a first bump feature and a second bump feature from the plurality of bump features.

2. The semiconductor device of claim 1, wherein
   the first substrate includes a semiconductor substrate having an integrated circuit formed thereon; and
   the second substrate includes an interposer bonded to the first substrate.

3. The semiconductor device of claim 2, wherein the interposer includes a silicon substrate having the plurality of vias.

4. The semiconductor device of claim 1, wherein the plurality of bump features are electrically disconnected from the first inductor and the second inductor.

5. The semiconductor device of claim 1, further comprising a dielectric under-fill material disposed between the first and second substrates such that the plurality of bump features are embedded in the under-fill material.

6. The semiconductor device of claim 1, wherein the magnetic material includes one of nickel, cobalt and iron.

7. The semiconductor device of claim 1, wherein the magnetic material is selected from the group consisting of nickel, nickel nitride, and nickel silicide.

8. The semiconductor device of claim 1, wherein the bump features are shaped to have a diameter and a height greater than the diameter.

9. The semiconductor device of claim 1, wherein the plurality of bump features includes a plurality of conductive micro-bumps.

10. A semiconductor device, comprising:
a semiconductor substrate having an integrated circuit (IC) device;
an interconnect structure disposed on the semiconductor substrate and coupled with the IC device; and
a transformer disposed on the semiconductor substrate and integrated in the interconnect structure, wherein the transformer includes:
a first inductor,
a second inductor conductively coupled with the first inductor, and
a magnetic feature that is disposed approximate the first and second inductors and is configured to enhance inductive coupling between the first and second inductors, wherein the magnetic feature includes a plurality of sub-features separated and distributed between the first and second inductors.

11. The semiconductor device of claim 10, wherein the magnetic feature includes a magnetic material having a relative permeability substantially greater than one.

12. The semiconductor device of claim 10, wherein the magnetic feature includes a magnetic material selected from the group consisting of nickel, iron, cobalt, or combinations thereof.

13. The semiconductor device of claim 10, wherein the magnetic feature is configured between the first and second inductors and is not electrically connected to the first and second inductors.

14. The semiconductor device of claim 10, wherein
the interconnect structure includes a plurality of metal layers having a first metal layer, a second metal layer and a via layer disposed therebetween;
the first inductor is disposed in the first metal layer;
the second inductor is disposed in the second metal layer; and
the magnetic feature is disposed in the via layer.

15. The semiconductor device of claim 10, wherein
the semiconductor substrate has a top surface;
each of the sub-features of the magnetic feature has a dimension D in a top view toward top surface; and
each of the first and second inductors includes a metal line with a width W,
wherein a ratio D/W ranges between about 5 and about 20.

16. The semiconductor device of claim 10, wherein:
the first inductor includes a first spiral structure disposed in a first plurality of metal layers;
the second inductor includes a second spiral structure disposed in a second plurality of metal layers over the first plurality of metal layers; and
the magnetic feature is formed in the first and second plurality of metal layers and is extended through the first and second spiral structures.

17. The semiconductor device of claim 10, wherein each of the first and second inductors includes multiple turns.

18. An integrated circuit structure, comprising:
a first substrate having a first inductor;
a second substrate having a second inductor configured to couple with the first inductor as a transformer;
a through substrate via (TSV) interposer bonded between the first and second substrates and having a plurality of via features embedded therein; and
at least a subset of the via features being configured approximate the first and second inductors and including a magnetic material with a relative permeability substantially greater than one.

19. The integrated circuit structure of claim 18, wherein the subset of via features are configured to be electrically disconnected from the first and second inductors.

20. The integrated circuit structure of claim 18, wherein the magnetic material is selected from the group consisting of nickel, cobalt, iron and combinations thereof.

* * * * *